United States Patent
Cooper et al.

(10) Patent No.: US 8,222,189 B2
(45) Date of Patent: Jul. 17, 2012

(54) PROCESS FOR DEPOSITION OF AMORPHOUS CARBON

(75) Inventors: Clark V. Cooper, Arlington, VA (US); Michael F. Mullen, Cheshire, CT (US)

(73) Assignee: United Technologies Corporation, Hartford, CT (US)

( * ) Notice: Subject to any disclaimer, the term of this patent is extended or adjusted under 35 U.S.C. 154(b) by 947 days.

(21) Appl. No.: 12/084,604

(22) PCT Filed: Dec. 13, 2005

(86) PCT No.: PCT/US2005/044983
§ 371 (c)(1),
(2), (4) Date: May 6, 2008

(87) PCT Pub. No.: WO2007/070026
PCT Pub. Date: Jun. 21, 2007

(65) Prior Publication Data
US 2009/0270283 A1    Oct. 29, 2009

(51) Int. Cl.
*F16C 33/04* (2006.01)
*C10M 103/02* (2006.01)

(52) U.S. Cl. ............................. 508/105; 508/103

(58) Field of Classification Search ............. 508/103, 508/105
See application file for complete search history.

(56) References Cited

U.S. PATENT DOCUMENTS

| | | | | |
|---|---|---|---|---|
| 5,482,602 A | * | 1/1996 | Cooper et al. | 204/192.11 |
| 5,527,559 A | * | 6/1996 | Simpson | 427/249.8 |
| 5,783,261 A | * | 7/1998 | Potter et al. | 427/526 |
| 6,261,424 B1 | * | 7/2001 | Goncharenko et al. | 204/192.38 |
| 6,330,131 B1 | * | 12/2001 | Nepela et al. | 360/234.5 |
| 2004/0038033 A1 | * | 2/2004 | Massler et al. | 428/408 |
| 2005/0139989 A1 | * | 6/2005 | Pai | 257/702 |

FOREIGN PATENT DOCUMENTS

| | | |
|---|---|---|
| JP | 2001-192864 | 7/2001 |
| JP | 2004501793 | 1/2004 |
| WO | 2005083752 | 9/2005 |

* cited by examiner

*Primary Examiner* — Jim Goloboy
(74) *Attorney, Agent, or Firm* — Carlson, Gaskey & Olds, P.C.

(57) ABSTRACT

There is a coated, dynamic contact surface. The contact has a substrate and a carbon-based coating on the substrate. The coating has a coefficient of friction of about 0.5 or less and an atomic hydrogen content of about 5% to about 25%. There is also a mechanical system. There is a method for increasing oil-out survivability in a mechanical system.

10 Claims, 4 Drawing Sheets

PROCESS FOR DEPOSITION OF AMORPHOUS CARBON

BACKGROUND OF THE INVENTION

1. Field of the Invention

The invention relates to a dynamic contact surface having a carbon-based coating. The invention further relates to a mechanical system that has a contact surface with a carbon-based coating thereon. The invention still further relates to a process for making the dynamic contact surface.

2. Description of the Prior Art

Some current helicopter designs utilize a cylindrical roller/split angular contact ball bearing combination bearing assembly as the production bearing assemblies for power transmission subsystems, e.g., the main transmission gearbox. The cylindrical rollers, contact ball bearings, the cages, and the inner and outer rings, including the raceways of such bearing assemblies, are typically formed from iron alloys. Iron alloys currently employed include Pyrowear 53, a surface-carburized steel manufactured by Carpenter Technology, and AISI 52100 steel.

A desirable design feature for helicopter power transmission gearboxes is the ability to maintain flight operations for sixty minutes (albeit at reduced power levels sufficient only to sustain level flight operations) under an "oil-out" condition, i.e., if the flow of lubricating/cooling oil to the transmission gearbox is lost. Current production bearing assemblies are not able to provide the foregoing design feature.

One approach to provide the desired design feature for oil-out conditions is to substitute ceramic functional components for the iron alloy functional components in production bearing assemblies to reduce contact friction. Another approach is to employ various coatings to the functional components in production bearing assemblies to reduce contact friction. The latter approach is exemplified in U.S. Pat. No. 5,482,602. Neither of the foregoing approaches provide a reduced level of contact friction sufficient to provide the desired design feature.

It would be further desirable to have a dynamic contact surface having a carbon-based coating exhibiting superior hardness and low frictional resistance. It would be further desirable to have a mechanical system having a contact surface(s) with a carbon-based coating exhibiting superior hardness and low frictional resistance. It would be further desirable to have a process for depositing such a carbon-based coating on a contact surface. It would yet be further desirable to have a helicopter transmission that is able to function for an extended period of time under oil-out conditions.

SUMMARY OF THE INVENTION

According to the present invention, there is a coated, dynamic contact surface. The contact has a substrate and a carbon-based coating on the substrate. The coating has a coefficient of friction of about 0.5 or less and an atomic hydrogen content of about 5% to about 25%, or more preferably about 5% to about 20%, or even more preferably about 5% to about 15%.

Further according to the present invention, there is a mechanical system having a plurality of components. The mechanical system has a contact surface and a contact countersurface. The contact surface has a substrate and a carbon-based coating on the substrate. The contact surface and the contact countersurface are in dynamic contact at least intermittently with respect to each other. The coating has a coefficient of friction of about 0.5 or less and an atomic hydrogen content of about 5% to about 25%, or more preferably about 5% to about 20%, or even more preferably about 5% to about 15%.

Further according to the present invention, there is a method for increasing oil-out survivability in a mechanical system having a plurality of components wherein each has at least one surface. The method has the following steps: a) placing at least one of the plurality of components into a vacuum chamber having at least one broad-beam ion gun therein; b) supplying an inert gas to the at least one broad-beam ion gun; c) ionizing the inert gas; d) accelerating the ionized inert gas to high kinetic energy; e) cleaning at least one surface of the at least one of the plurality of components with the ionized and accelerated inert gas; f) optionally accelerating the ionized inert gas, by itself or in combination with an ionized reactive gas, toward a target composed of a desired material to sputter-deposit an intermediate, adherence-promoting layer; g) supplying a hydrocarbon gas having at least 25 wt % acetylene to the at least one broad-beam ion gun; h) ionizing the hydrocarbon gas; i) accelerating the ionized hydrocarbon gas to high kinetic energy; and j) directing the ionized and accelerated hydrocarbon gas to the at least one surface of the at least one of the plurality of components at a temperature lower than 300° F. to deposit a carbon-based coating thereon.

Further according to the present invention, the method for increasing the oil-out survivability may include an optional step, in which the carbon-based coating is deposited simultaneously with another constituent or constituents, such as but not limited to about 0.5-50 atomic percent of a transition metal or metalloid, to result in a coating mixture or composite coating.

Further according to the present invention, there is a method for increasing oil-out survivability in a mechanical system having a plurality of interrelating components having at least one dynamic surface. The method has the step of providing to the at least one dynamic surface a carbon-based coating layer having a coefficient of friction of about 0.5 or less and an atomic hydrogen content of about 5% to about 25%, or more preferably about 5% to about 20%, or even more preferably about 5% to about 15%

DETAILED DESCRIPTION OF THE INVENTION

Figure 1:
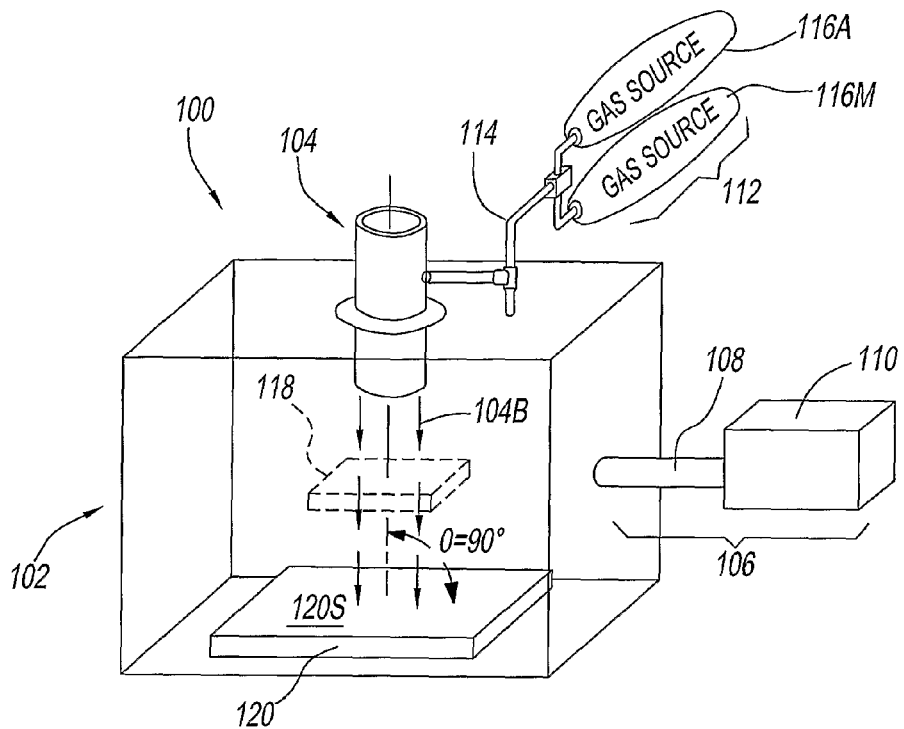
FIG. 1 illustrates an exemplary schematic embodiment of an apparatus for implementing broad-beam ion deposition coating methods according to the present invention wherein a carbon-based layer or coating is deposited indirectly or directly on the dynamic surface of an article.

It was surprisingly found that there could be a dynamic contact surface exhibiting superior hardness, low frictional resistance, and a low abrasive wear rate. It was further surprisingly found that there could be a mechanical component having a contact surface(s) exhibiting superior hardness, low frictional resistance, and a low abrasive wear rate. It was surprisingly found that there could be a process for depositing a carbon-based coating to form such a contact surface. It was surprisingly found that there could be a helicopter transmission that is able to function for an extended period of time under oil-out conditions.

Contact surfaces coated with the carbon according to the process of the present invention exhibit a lower proportion of atomic hydrogen therein than carbon-based coatings made with processes different than that of the present invention. The carbon-based coatings made with the process of the present invention exhibit an atomic hydrogen content of about 5% to about 25%, or more preferably about 5% to about 20%, or even more preferably about 5% to about 15%, atomic mole percent.

The reduced atomic hydrogen content of the carbon-based coatings affords one or more of the following performance advantages: superior hardness, low frictional resistance, and low abrasive wear rate. A coated contact surface has a coefficient of friction of about 0.5 or less, preferably about 0.2 or less, and most preferably about 0.1 or less. A contact surface has a hardness of about 10 giga Pascals or more, preferably about 12 giga Pascals or more, and most preferably about 15 giga Pascals or more. A contact surface has a abrasive wear rate of about $10^{-5}$ $m^3m^{-1}N^{-1}$ or less, more preferably about $10^{-10}$ $m^3m^{-1}N^{-1}$ or less, and most preferably about $10^{-14}$ $m^3m^{-1}N^{-1}$ or less.

An important feature in coating contact surfaces is the use of broad beam ion deposition. Another important feature is the use of acetylene as the ion-generating gas.

Broad-beam ion deposition is a coating process that may be considered to be a hybrid CVD-PVD method. It is related to chemical vapor deposition (CVD) in that the hydrocarbon source gas is supplied to and dissociated by an ionizing filament that is an element within the Kaufman ion source. Similarly, it is related to physical vapor deposition (PVD) processes in that ionized species are accelerated with significant kinetic energy to clean both targets and substrates as well as to sputter-deposit atomically clean target material onto atomically clean substrate surfaces. Specifically, the sequential steps for performing broad-beam ion deposition include (1) abrasive and/or solvent cleaning of the substrate, (2) inserting the cleaned substrate into a suitable deposition chamber, (3) evacuating the deposition chamber to a predetermined base pressure, (4) ion-sputter conditioning the substrate and target surfaces, (5) sputter-depositing an intermediate, adherence-promoting layer onto the substrate surface, and (6) depositing a carbon-based coating on the interface layer of the substrate surface.

Step (1) of the above-described process entails macroscopic conditioning of the substrate surface by mechanical and/or chemical techniques. Step (4), ion-sputter conditioning of the target and substrate surfaces, is accomplished by ionizing an inert gas to form an ion beam that has a predetermined beam current density and accelerating energy and directing the ion beam onto the dynamic surface. Deposition of an intermediate layer, step (5), is achieved by ionizing a gas, typically an inert gas such as argon (Ar) or helium (He) to form an ion beam, having a predetermined beam current density and accelerating energy, and directing the ion beam onto a target to dislodge atoms therefrom. After sputter cleaning the target and substrate surfaces to render them atomically clean, the dislodged target atoms are collected on the substrate surface to form the intermediate, adherence-promoting layer. The predetermined beam current density for ion sputtering conditioning and interface layer deposition is within the range of about 1.5 $mA/cm^2$ to about 3.5 $mA/cm^2$, and preferably about 2.5 $mA/cm^2$. The predetermined accelerating energy for ion sputtering conditioning and interface layer deposition is within the range of about 0.7 keV to about 1.5 keV, and preferably about 1.0 keV. The thickness of the interface layer is within the range of about 50 to about 500 nm, and preferably within the range of about 100 nm to about 150 nm.

The carbon-based coating is deposited on the interface layer by ionizing a carbon-based gas, which contains acetylene, to form an ion beam having a predetermined beam current density and a predetermined accelerating energy and directing the ion beam for deposition of carbon ions on the intermediate, adherence-promoting layer for the deposition of the outer carbon-based coating. The predetermined beam current density for depositing the carbon-based coating on the intermediate layer is within the range of about 1.5 $mA/cm^2$ to about 3.5 $mA/cm^2$, and preferably about 2.5 $mA/cm^2$. The predetermined accelerating energy for depositing the carbon-based coating on the interface layer is within the range of about 200 eV to about 1000 eV, and preferably within the range of about 450 eV to about 700 eV, and more preferably about 450 eV. The thickness of carbon-based coatings deposited utilizing the broad-beam ion deposition coating methods according to the present invention have a thickness within the range of about 500 nm to about 2000 nm, and preferably within the range of about 700 nm to about 1500 nm.

The process of the present invention employs a precursor hydrocarbon or carbonaceous gas. The gas is preferably composed partially or entirely of acetylene. The gas is preferably composed of at least 25 wt %, more preferably at least 50 wt %, and most preferably at least 75 wt % of acetylene based on the total weight of the hydrocarbon content of the gas. Other useful hydrocarbons that may be used in combination with acetylene are methane, ethane, propane, and the like.

Figure 2:
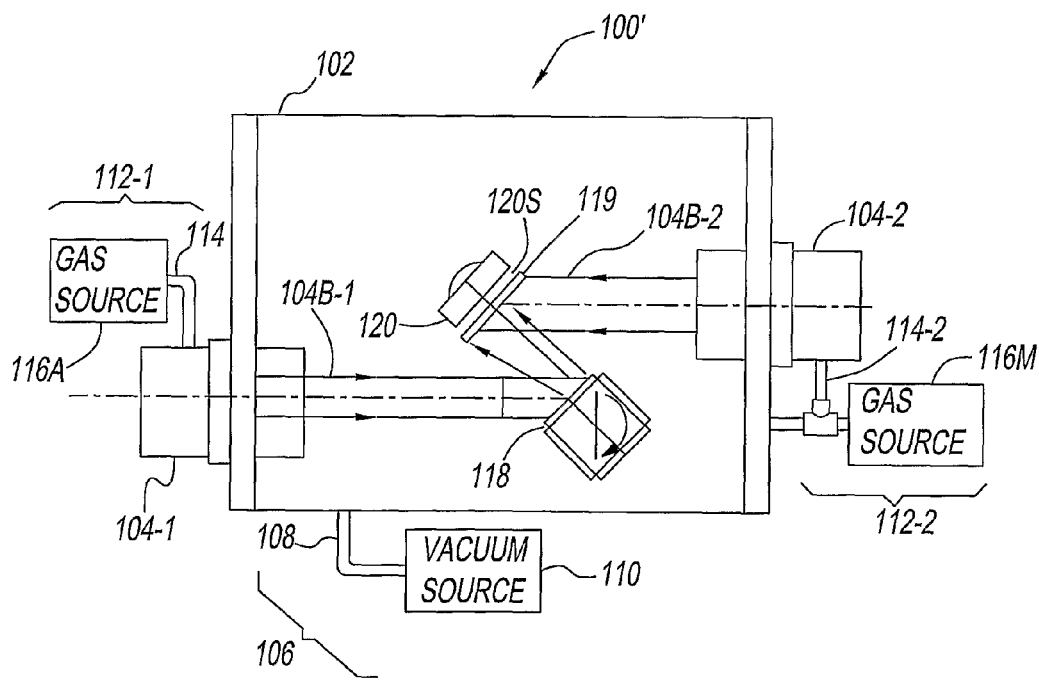
FIG. 2 illustrates another exemplary schematic embodiment of an apparatus for implementing broad-beam ion deposition coating methods according to the present invention wherein a carbon-based layer or coating is deposited indirectly or directly on the dynamic surface of an article.

FIG. 1 is schematic representation of one exemplary embodiment of an apparatus 100 for implementing broad-beam ion deposition coating methods 10 or 10' according to the present invention wherein a carbon-based coating is deposited indirectly or directly on one or more dynamic surfaces of an article. FIG. 2 is another exemplary embodiment of an apparatus 100' for implementing the broad-beam ion deposition coating methods 10 or 10' according to the present invention wherein a carbon-based coating is deposited indirectly or directly on one or more dynamic surfaces of an article. The apparatuses 100 and 100' are configured to implement the broad-beam ion deposition processes described hereinbelow, a hybrid physical vapor deposition-chemical vapor deposition (PVD-CVD) process wherein the generated plasma cloud is proximal to the broad-beam ion gun(s), i.e., distal from the dynamic surface of the article to be coated.

The apparatus 100 of FIG. 1 includes a deposition chamber 102, a broad-beam ion gun 104 that is operative to generate an ion beam 104B, a vacuum means 106, e.g., a vacuum line 108 and a vacuum pump 110, fluidically interconnected to the deposition chamber 102 and operative for evacuating the deposition chamber, a gas supply means 112, e.g., gas line(s) 114 and one or more gas sources 116, fluidically interconnected to the broad-beam ion gun 104 and the deposition chamber 102 for supplying gas thereto, and a target 118. For the broad-beam ion deposition coating methods described hereinbelow, the gas line 114 may be alternately fluidically interconnected to a first gas source 116A, e.g., argon, helium, and a carbon-based gas source 116M, e.g., acetylene and methane (alternatively, each individual gas source 116A, 116M may be fluidically interconnected to the broad-beam ion gun 104 and the deposition chamber 102 utilizing individual dedicated gas lines 112). The apparatus 100' of FIG. 2 includes the deposition chamber 102, first and second broad-beam ion guns 104-1, 104-2 operative to generate ion beams 104B-1, 104B2 for steps 22 and 24, respectively, a vacuum means 106, individual gas supply means 112-1, 112-2 for the respective broad-beam ion guns 104-1, 104-2, and the deposition chamber 102, the target 118, and a shutter 119.

Figure 7:
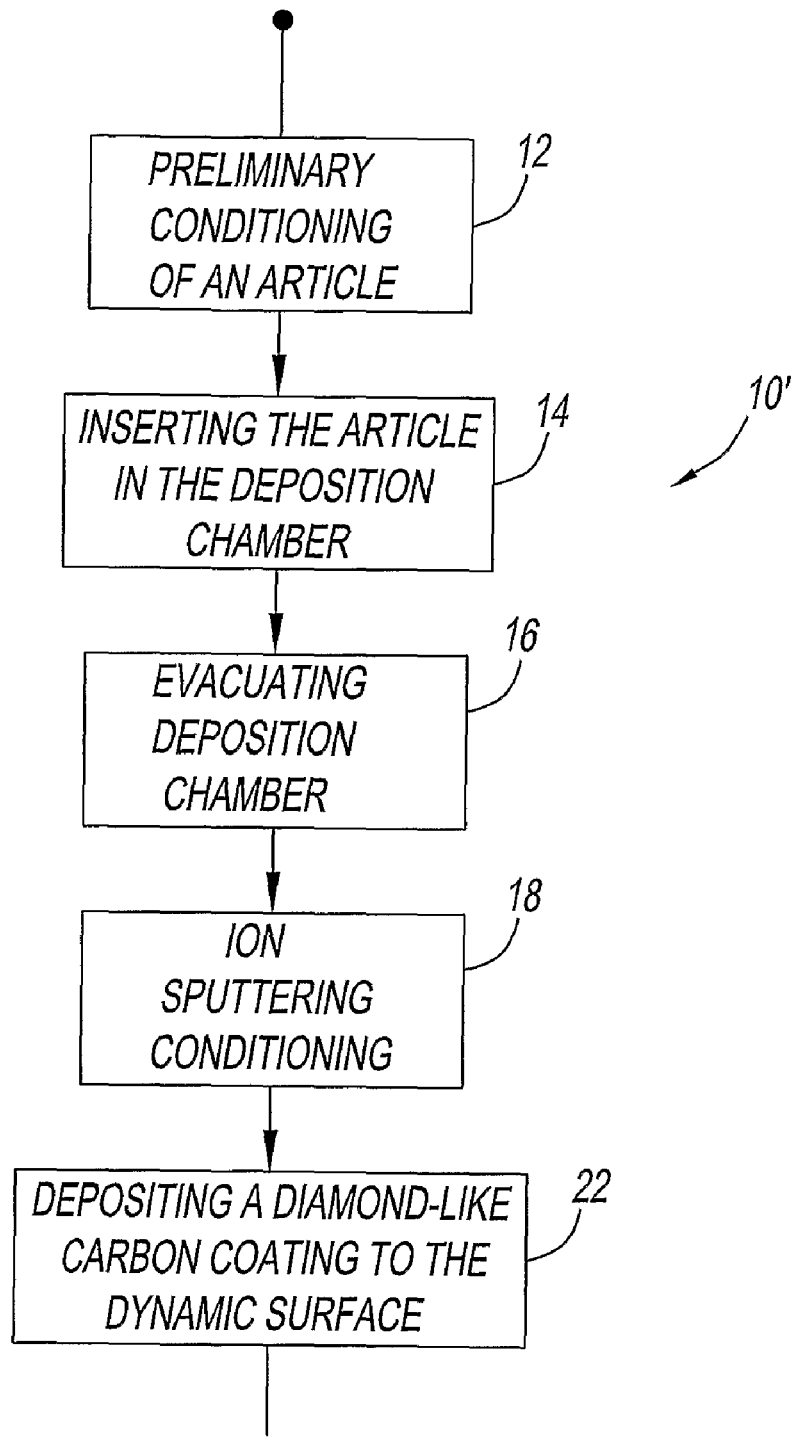
FIG. 7 is a process flow chart for another broad-beam ion deposition coating method according to the present invention illustrating the steps for depositing a DLC coating directly on a dynamic surface of an article that does not exhibit adherence difficulties.

The broad-beam ion gun 104, the vacuum means 106, and the gas supply means 112 are schematically represented inasmuch as such systems are conventional and of the type generally known to those skilled in the art. For example, the broad-beam ion gun 104 is typically a Kaufman-type broad-beam ion gun (see, e.g. FIG. 7 and the corresponding disclosure in the specification in U.S. Pat. No. 4,793,908) which is operative to ionize a supplied gas (utilizing a hot filament such that the generated plasma is adjacent the ion gun 104 and not the surface to be carbon coated) to generate an ion beam and which may be precisely regulated to accelerate the resultant ion beam at a predetermined beam current density and a predetermined accelerating energy. Since such systems are conventional and generally known to those skilled in the art, a detailed description of the mechanical and functional characteristics thereof is not included herein.

Figure 8:
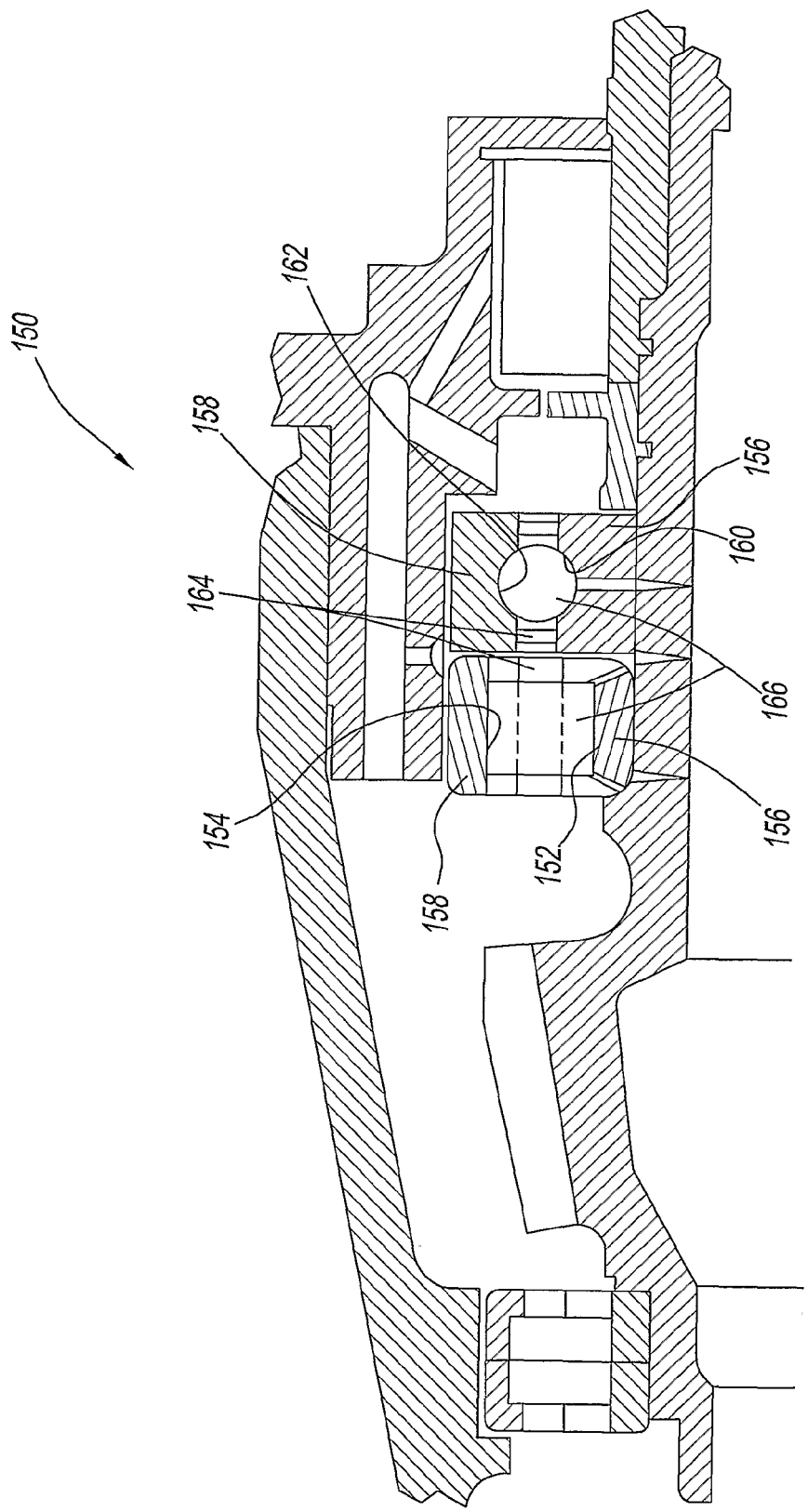
FIG. 8 is a partial cross-sectional view of a cylindrical roller/split angular contact ball bearing combination bearing assembly as an exemplary application for the broad-beam ion deposition coating methods according to the present invention.

Also exemplarily illustrated in FIGS. 1 and 2 is an article 120 to have deposited thereon a carbon-based coating, with one dynamic surface 120S thereof positioned within the deposition chamber 102 for coating by means of the broad-beam ion deposition coating methods 10, 10' described hereinbelow. The term "article" as used herein encompasses various types of engineering mechanical devices and/or manufacturing tooling having one or more surfaces thereof engaged in interactive rolling and/or sliding frictional contact with countersurfaces of the same device, a complementary mechanical device, or a workpiece. The interactive contact surfaces of such mechanical devices and/or manufacturing tooling are defined herein as dynamic surfaces. Such dynamic surfaces are subject to mechanical degradation due to interactive sliding and/or rolling frictional contact, and are therefore, prime candidates for carbon-based coatings. Depending upon the complexity of the structural configuration of a given article, the article may have one or more distinct dynamic surfaces. As used herein, the term "dynamic surface" encompasses all dynamic surfaces of an article to be coated utilizing one of the broad-beam ion deposition coating methods 10 or 10' according to the present invention. By way of illustration only, which is not intended to be limiting, specific applications for the broad-beam ion deposition coating methods 10 or 10' according to the present invention include depositing carbon-based coatings on the inner and outer raceways (each raceway comprises a single continuous dynamic surface) of a cylindrical roller/split angular contact ball bearing combination bearing assembly (the roller/bearing combination and races are in predominately rolling frictional contact), depositing carbon-based coatings on the teeth (each face surface of each gear tooth comprises a single continuous dynamic surface) of a helicopter main transmission gear (the interacting gear teeth are in both rolling and sliding frictional contact), and depositing carbon-based coatings on the annular microstructures (the flank and land surfaces of each annular microstructure comprise a single dynamic surface) of a rolling die (tool) utilized to form detailed heat transfer surfaces in a copper sheeting workpiece which is subsequently utilized to fabricate heat exchanger tubing for air conditioners (the flank, land surfaces of the annular microstructures engage the workpiece in both sliding frictional contact (85-80% of total contact) and rolling frictional contact (15-20% of total contact)). A representative non-limiting bearing assembly is identified by the numeral 150 and is shown in FIG. 8. Assembly 150 has an inner raceway 152 and an outer raceway 154, respectively. Assembly 150 also has an inner ring 156 and an outer ring 158, respectively. Assembly 150 also has an inner raceway 160 and an outer raceway 162, respectively. Assembly 150 also has cages 164 and a rolling element 166, respectively.

Broad-beam ion deposition coating methods 10, 101 according to the present invention for depositing a carbon-based coating indirectly or directly on a dynamic surface 120S are described in the following paragraphs. The specific broad-beam ion deposition coating method 10 or 10' utilized to deposit a carbon-based coating on a dynamic surface 120S depends upon the material composition of the dynamic surface 120S of the article 120 to be coated. The dynamic surfaces of articles formed of certain material compositions may exhibit adherence difficulties with respect to carbon-based coatings directly deposited thereon. For example, the dynamic surfaces of articles formed from iron, iron-based alloys, titanium, and titanium-based alloys may exhibit adherence difficulties. Carbon ions deposited directly on the dynamic surfaces of such articles generally exhibit poor bonding with the dynamic surfaces or no growth. The factors which contribute to this phenomenon are not well understood, but one contributing factor may be deposited-carbon diffusion. That is, carbon ions deposited directly on the dynamic surface diffuse into the article, i.e., migrate away from the near-surface region of the dynamic surface. Deposited-carbon diffusion and other factors (defined herein as "adherence difficulties") adversely affect the characteristics, especially the adhesion characteristics, of carbon-based coating deposited directly on the dynamic surface of such articles. It has been determined that such articles often require an interface layer 122 (see FIG. 1C), i.e., a layer deposited directly on the dynamic surface 120S of the article 120, prior to deposition of the carbon-based coating. The carbon-based coating 124 is subsequently deposited on the interface layer 122, i.e., the carbon-based coating is indirectly deposited on the dynamic surface of the article.

The interface layer 122 is formed from a material composition that exhibits good adhesion characteristics with both the dynamic surface 120S and subsequently deposited carbon-based coating 124 as a result of broad-beam ion deposition, and is operative to effectively limit deposited-carbon diffusion into the article during carbon ion deposition, thereby ensuring enhanced adhesion characteristics for the subsequently deposited carbon-based coating. For example, acceptable material compositions for the interface layer 122 for iron, iron-based alloys, titanium, and titanium-based alloys include silicon, molybdenum, compounds based upon these and similar transition metals (columns IIIB-VIIIB, IB, and IIB of the periodic table), including, for example, chromium (Cr), nickel (Ni), aluminum (Al), silicon (Si), solid solutions or compounds containing silicon and carbon (SiC, stoichiometric or non-stoichiometric; crystalline or amorphous), solid solutions or compounds containing silicon and nitrogen, and other transition metals, metalloids, and transition-metal solid solutions or compounds.

The preliminary conditioning step involves one or more substeps that entail macroscopic physical, chemical, and/or electro-chemical conditioning of the dynamic surface 120S for broad-beam ion deposition of the interface layer or the carbon-based coating. Depending upon the structural and functional characteristics required for the dynamic surface 120S, a mechanical conditioning substep 12A may be utilized to mechanically prepare the dynamic surface 120S. For example, the dynamic surface 120S may be mechanically polished or machine-ground, to enhance the surface finish thereof for the broad-beam ion deposition of the interface layer or the carbon-based coating. Further, the dynamic surface 120S may be chemically and/or electro-chemically cleaned in a substep 12B to remove contaminants therefrom by chemical reaction. For example, substep 12B may entail degreasing the dynamic surface 120S by washing thereof utilizing one or more solvents. The solvents utilized in substep 12B depend upon the nature of the contaminants to be removed, and the selection of such solvent(s) is within the general knowledge of one skilled in the art. Typically, organic solvents are utilized in substep 12B.

The inserting step comprises placing the article 120 within the deposition chamber 102 and spatially orientating the dynamic surface 120S of the article 120 with respect to the trajectory of the ion beam 104B generated by the broad-beam ion gun 104 to achieve a predetermined trajectory angle θ) (see, e.g., FIG. 1) therebetween. Preferably, the dynamic surface 120S is positioned orthogonal to the ion beam 104B, i.e., trajectory angle θ=90 degrees (see FIG. 1), as this spatial orientation ensures the best adhesion characteristics for broad-beam ion deposition of the carbon-based coating and the optimal deposition rate. Depending upon the complexity of the structural configuration of dynamic surface 120S of the article 120, however, the ion beam 104B may be non-orthogonally orientated, i.e., angled such that the trajectory angle (θ)<90 degrees, with respect to the dynamic surface 120S to ensure the requisite coating of the dynamic surface 120S. For example, one application for the broad-beam ion deposition coating methods 10, 10' according to the present invention involves depositing a carbon-based coating on the dynamic surface of a rolling die to enhance the functional characteristics thereof, e.g., increased hardness, increased wear resistance, and particularly to provide high lubricity which eliminates the need to use contaminating lubricants during the forming process since the high lubricity of a carbon-coated tool significantly reduces metal-particulate-forming forces. The rolling die must be spatially orientated at a specific trajectory angle θ<90 degrees. For dynamic surfaces 120S having a complex configuration, e.g., the rolling die, it may be necessary to reposition the dynamic surface 120S one or more times (or continually) to ensure complete coating thereof by ion beam deposition according to the methods 10, 10' of the present invention.

The deposition chamber 102 is evacuated in step 16 utilizing the vacuum means (vacuum line 106, vacuum source 108) which is fluidically interconnected to the deposition chamber 102. For depositing carbon-based coatings on the working surfaces 120S of the articles 120 described hereinbelow utilizing the broad-beam ion deposition coating methods 10, 10' according to the present invention, the deposition chamber 102 is evacuated to a base pressure equal to or less than $3\times10^{-5}$ torr. In preparing carbon-coated Pyrowear 53 test specimens as described hereinbelow in further detail, the deposition chamber 102 was evacuated to a base pressure of about $2.5\times10^{-5}$ torr.

The dynamic surface 120S is microscopically conditioned in the deposition chamber 102 as a precursor to implementing the broad-beam ion deposition coating method 10 or 10' according to the present invention. Ion sputtering is utilized for the microscopic conditioning of step 18 to eliminate unwanted residue remaining after the preliminary conditioning step 12, e.g., oxides and/or contaminants that are not amenable to mechanical conditioning and/or are not soluble in solvents. In addition, ion sputtering microscopically roughens the dynamic surface 120S to facilitate subsequent ion deposition of the interface layer 122 (or the carbon-based coating 124 in the broad-beam ion deposition coating method 10' described hereinbelow). With respect to FIG. 1, a sputtering gas such as argon is introduced into the broad-beam ion gun 104 utilizing the gas supply means 112 (line 114, gas source 116A) where ionization thereof is effected by means of the broad beam ion gun 104 to form Ar+. The Ar+ ions in the form of the ion beam 104B are accelerated toward the dynamic surface 120S by the broad-beam ion gun 104 where the impact energy thereof effectuates sputter cleaning of the dynamic surface 120S. With respect to FIG. 2, the broad-beam ion gun 104-2 is utilized for ion sputter conditioning, with the article 120 rotated so that the dynamic surface 120S thereof is perpendicular to the ion beam 104B-2. The apparatus 100' of FIG. 2 provides the further capability for ion sputtering conditioning of the target 118 prior to step 22 utilizing the broad-beam ion gun 104-1. If the target 118 is ion sputtering conditioned, the shutter 119 is operative to shield the dynamic surface 120S from any ions dislodged during the target conditioning procedure. For the described broad-beam ion deposition coating methods 10, 10' according to the present invention, the broad-beam ion gun 104 utilizes an accelerating energy within the range of about 0.7 keV to about 1.5 keV, and preferably about 1.0 keV, and a beam current density within the range of about 1.5 mA/cm$^2$ to about 3.5 mA/cm$^2$, and preferably about 2.5 mA/cm$^2$. The dynamic surface 120S is conditioned for a predetermined period of time, the time period being dependent, inter alia, on the acceleration energy and the beam current density of the ion beam 104B, and the configurational complexity of the dynamic surface 120S. By way of example, the period for ion sputtering conditioning of the Pyrowear 53 test specimens was approximately 300 seconds. In addition to argon gas (which is inexpensive and works reasonably well), other inert gases such as helium may be utilized to form ions for the ion sputtering conditioning of step 18.

Figure 3:
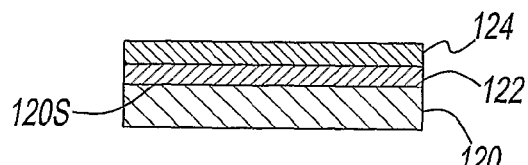
FIG. 3 is a partial cross-sectional view depicting a carbon-based coating indirectly deposited on an interface layer deposited on the dynamic surface of an article.
Figure 4:
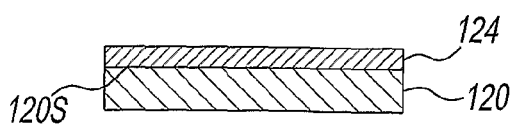
FIG. 4 is a partial cross-sectional view depicting a carbon-based coating directly deposited on the dynamic surface of an article.
Figure 5:
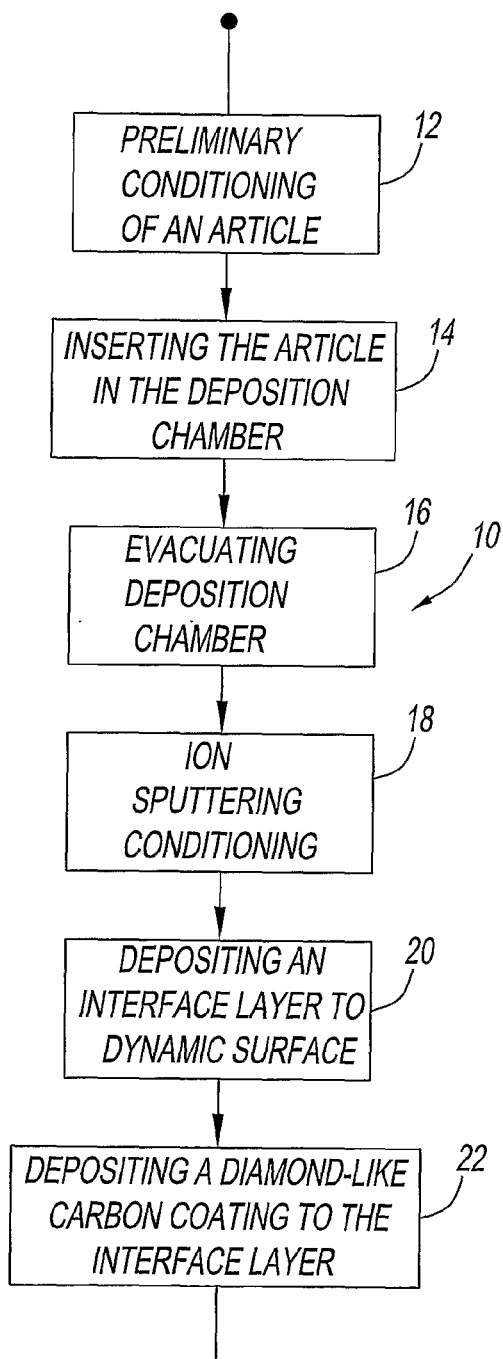
FIG. 5 is a process flow chart for one broad-beam ion deposition coating method according to the present invention illustrating the steps for depositing a DLC coating indirectly on a dynamic surface of an article that exhibits adherence difficulties.
Figure 6:
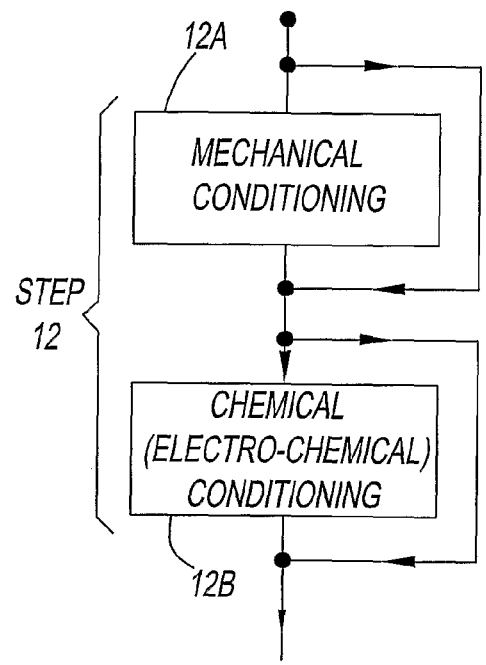
FIG. 6 depicts optional substeps for the broad-beam ion deposition coating method of FIG. 5 or 7.

An interface layer 122 (see FIG. 3) is deposited on the dynamic surface 120S in step 20. A gas such as argon (Ar) is supplied to the broad-beam ion gun 104 (the broad-beam ion gun 104-1 of FIG. 2) by means of the gas supply means 112 (the gas supply means 112-1). The supplied gas is ionized to form the ion beam 104B (the ion beam 104B-1) and accelerated towards the target 118 by the broad-beam ion gun 104 (broad-beam ion gun 104-1). The accelerating energy for step 20 is within the range of about 0.7 keV to about 1.5 keV, and preferably about 1.0 keV, and a beam current density within the range of about 1.5 mA/cm$^2$ to about 3.5 mA/cm$^2$, and preferably about 2.5 mA/cm$^2$.

The target 118 is fabricated from a material composition that exhibits good adhesion characteristics with both the material composition of the dynamic surface 120S and the subsequently deposited carbon-based coating 124, and that inhibits carbon ion diffusion. As disclosed hereinabove, acceptable material compositions for the target 118 for the dynamic surfaces 120S of articles 120 fabricated from iron, iron-based alloys, titanium, and titanium-based alloys include silicon, molybdenum, compounds and solid solutions based upon these and similar transition metals (columns IIIB-VIIIB, IB, and IIB of the periodic table), including, for example, chromium, aluminum, and silicon. The target 118 is interposed between the broad-beam ion gun 104 (the broad-beam ion gun 104-1) and the dynamic surface 120S, i.e., in the trajectory of the ion beam 104B (ion beam 104B-1), so that the accelerated ions comprising the ion beam 104B (ion beam 104B-1) impact the target 118. The impact energy of the accelerated ions is sufficient to dislodge atoms from the target 118, the dislodged atoms being subsequently deposited on the dynamic surface 120S to form the interface layer 122. The interface layer 122 is operative to provide an effective diffusion barrier for the carbon ions to be deposited in step 22 to form the carbon-based coating. The interface layer 122 formed in step 20 should have a thickness sufficient to inhibit deposited-carbon diffusion. It has been determined that interface layers 122 having a thickness within the range of about 100 nm to about 150 nm satisfactorily inhibit deposited-carbon diffusion. Subsequent to the deposition of the interface layer 122 on the dynamic surface 120S, the target 118 of the apparatus 100 is removed from the trajectory of the ion beam 104B generated by the broad-beam ion gun 104.

The material composition of the target 118 and the partial pressure of gases in the deposition chamber 102 in combination determine the composition of the interface layer 122 deposited on the dynamic surface 120S. For example, the target 118 may be fabricated from silicon (Si) to form a silicon interface layer 122 on the dynamic surface 120S that is operative to inhibit deposited-carbon diffusion where the dynamic surface 120S of the article 120 is fabricated from material composition such as iron, iron-based alloys, titanium, or titanium-based alloys. If argon gas is supplied to the broad-beam ion gun 104 (broad-beam ion gun 104-1) in step 20, Ar+ ions are accelerated therefrom to impact the Si target 118 with sufficient impact energy to dislodge Si atoms from the Si target 118, the dislodged Si atoms possessing sufficient impact energy to be deposited on the dynamic surface 120S to form an interface layer 122 of elemental silicon (Si). If acetylene gas at a predetermined partial pressure is present in the deposition chamber 102 during sputtering of the silicon target 118 by Ar+ ions, the dislodged Si atoms combine with the acetylene gas molecules in the deposition chamber 102 and are deposited on the dynamic surface 120S to form an interface layer 122 of amorphous silicon-carbon-hydrogen, i.e., a-Si:C:H, on the dynamic surface 120S. In fabricating the Pyrowear 53 test specimens described hereinbelow, acetylene gas at a predetermined partial pressure of about $1.5 \times 10^{-4}$ torr was present in the deposition chamber 102. Broader ranges of acetylene gas partial pressures are possible, such as about $1.5 \times 10^{-5}$ to about $1 \times 10^{-3}$ torr. A partial pressure of $1.5 \times 10^{-4}$ torr is preferred.

Carbon-based coating 124 is deposited on the interface layer 122. As a general rule, the deposition of the carbon-based coating 124 is more sensitive to process parameters, i.e., accelerating energy, beam current density, than the deposition of the interface layer 122. A carbon-based gas (as used herein, a carbon-based gas is a gas that provides carbon ions (C+) when dissociated or ionized, e.g., a hydrocarbon gas such as acetylene ($C_2H_2$) and methane ($CH_4$) or a gas that produces hydrocarbons as a result of decomposition or reaction) is supplied to the broad-beam ion gun 104 (broad-beam ion gun 104-2) by the gas supply means 112 (gas supply means 112-2) and ionized by the broad-beam ion gun 104 (broad-beam ion gun 104-2) to provide, inter alia, a supply of carbon ions (C+). Where acetylene is utilized as the supply gas, the resulting carbon ions (C+) and hydrogen ions (H+) comprising the ion beam 104B (ion beam 104B-2) are accelerated toward the dynamic surface 120S by the broad-beam ion gun 104 (broad-beam ion gun 104-2). The carbon ions (C+) deposited on the interface layer 122 form the carbon-based coating 124 for the dynamic surface 120S. It will be appreciated that hydrogen ions (H+) are also deposited on the interface layer 122. Secondary ion mass spectrometry (SIMS) was employed to estimate the concentration of hydrogen incorporated in carbon-based coatings 124 deposited on a dynamic surface 120S utilizing one of the broad-beam ion deposition coating methods 10, 10' according to the present invention. SIMS results indicate that the concentration of hydrogen in such carbon-based coatings 124, in which methane ($CH_4$) is used as the carbonaceous (hydrocarbon) source gas is approximately 30 atomic percent; conversely, carbon-based coatings synthesized according to the present invention, in which acetylene ($C_2H_2$) is used as the source gas, incorporate hydrogen in a concentration of about 5-25 atomic percent.

The accelerating energy for step 22 should be within the range of about 200 eV to about 1000 eV, and preferably within the range of about 450 eV to about 700 eV, and more preferably about 450 eV. If the accelerating energy provided by the broad-beam ion gun 104 is too high, i.e., >about 1000 eV, the impact energy of the ions deposited onto the dynamic surface 120S will cause resputtering. That is, previously deposited ions will be ejected from the dynamic surface 120S by the impact energy of incoming ions, i.e., the high impact energy thereof. If the accelerating energy provided by the broad-beam ion gun 104 is too low, i.e., <about 200 eV, the interface layer formed by the deposited ions exhibits poor adhesion characteristics due to the low impact energy of the deposited ions. The beam current density of the generated ion beam 104B (ion beam 104B-2) should be within the range of about 1.5 mA/cm$^2$ to about 3.5 mA/cm$^2$, and preferably about 2.5 mA/cm$^2$.

The specific thickness of the carbon-based coating 124 is determined in part by the load forces to which the carbon-coated dynamic surface 120S is to be subjected to and in part by the type of frictional contact to which the carbon-coated dynamic surface 120s is to be subjected to. It has been determined that when the dynamic surface 120S is subjected to pure rolling frictional contact, e.g., cylindrical roller bearings, the most effective thickness for the carbon-based coating 124 is less than the carbon-coating thickness required when the dynamic surface 120S is subjected exclusively to sliding frictional contact. Pragmatically, however, most dynamic surfaces 120S will be subjected to an admixture of rolling and sliding frictional contact, and therefore the thickness requirement for the carbon-based coating 124 will be within the range defined between pure sliding frictional contact and pure rolling frictional contact. For example, the rolling die described hereinbelow is subject to about 15-20% sliding frictional contact and about 85-80% rolling frictional contact. It has been determined that carbon-based coatings 122 having a thickness within the range of about 500 nm to about 2000 nm, and preferably within the range of about 700 nm to about 1500 nm, are sufficient for most engineering device and manufacturing tooling applications.

"Oil-out survivability" is defined to be the ability of a component within a mechanical system or the entire mechanical system itself, to survive and continue to operate (execute its intended function) in the event that the supply of lubricant is interrupted or compromised. Such conditions include, but are not limited to, diminished lubricant supply caused by accelerations during aircraft maneuvers; failure of components that comprise the lubrication system, including but not limited to the oil pump; ballistic damage to the mechanical system housing or other components within the system caused by arms fire or explosion; mis-assembly of components within the mechanical system or the entire mechanical system; and failure of components within other systems or failure of other entire systems, resulting in degradation or disruption of the lubrication system or the lubricant, such as but not limited to lubricant dilution with fuel, hydraulic fluid, and the like.

"Inert gas" is defined to be any member or plurality of members of group 18 (group 8A) elements of the periodic table, including argon (Ar), helium (He), neon (Ne), krypton (Kr), xenon (Xe), and radon (Rn).

"Carbon-based coating" is defined to be a coating that is deposited by means of a physical (PVD) or chemical (CVD) vapor deposition process, or a hybrid PVD-CVD process, in which carbon is the major constituent (element). Carbon shall constitute the "major" element in the event that it comprises 50 atomic percent or more of all constituents. The "carbon-based coating" may be crystalline or amorphous or contain structures and other characteristics of both crystalline and amorphous phases.

"Adherence-promoting intermediate coating layer" is defined to be any coating that lies between the component substrate and the carbon-based coating that increases the level of adherence or adhesion between the carbon-based coating and the component substrate. Examples include, but are not limited to, chromium (Cr), nickel (Ni), aluminum (Al), silicon (Si), solid solutions or compounds containing silicon and carbon (SiC, stoichiometric or non-stoichiometric; crystalline or amorphous), solid solutions or compounds containing silicon and nitrogen, and other transition metals, metalloids, and transition-metal solid solutions and compounds.

Other teachings regarding useful techniques for broad beam ion deposition are disclosed in U.S. Pat. No. 5,482,602, which is incorporated herein in its entirety.

The following are examples of the present invention. The examples are illustrative of the invention and not to be construed as limiting.

EXAMPLES

Comparative Example 1

An carbon-based coating was deposited via broad-beam ion deposition onto steel substrates using dissociated acetylene ($C_2H_2$) at a temperature of about 120° C. A comparative carbon-based coating was likewise deposited using dissociated methane at a temperature of about 100° C. The coatings were tested for nanoindentation (ultralow-load indentation) to measure the hardness and indentation modulus. Hardness and indentation modulus were measured with a Nanoindenter XP (MTS Nano Instruments Co.)

The acetylene-derived coating exhibited far superior to hardness and indentation elastic modulus to the methane-derived coating. The acetylene-derived coating exhibited a hardness and indentation elastic modulus of 23.6 and 206 GPa, respectively. These values exceeded those of the methane-derived coating by multiples of 3.1 and 3.5 times greater, respectively.

Example 2

To demonstrate the efficacy of the broad-beam ion deposition coating method, several test specimens composed of the Pyrowear 53 (Carpenter Technology) alloy had a-C:H coatings of different thicknesses deposited thereon via the broad-beam ion deposition method taught in U.S. Pat. No. 5,482,602. The Pyrowear 53 test specimens were first mechanically polished and then thoroughly degreased in organic solvents. The prepared Pyrowear 53 test specimens were introduced into the broad-beam, ion-deposition chamber in such a manner that the functional surfaces thereof were orthogonal to the ion beam generated by the broad-beam ion gun. The deposition chamber was evacuated to a base pressure of approximately $2.5 \times 10^{-5}$ torr, and the Pyrowear 53 test specimens were ion-sputter cleaned with $Ar^+$ at an accelerating energy of about 1.0 keV and a beam current density of 2.5 mA/cm². Since Pyrowear 53 is an iron-based alloy, it is subject to adherence difficulties. Therefore, an interface layer composed of Si or amorphous hydrogenated silicon carbide (a-Si: C) was deposited to the sputter-cleaned test specimens to a thickness of approximately 100 nm. While methane ($CH_2$) gas was taught as the preferred precursor carbonaceous or hydrocarbon gas in U.S. Pat. No. 5,482,602, additional research conducted since its issuance has demonstrated that a-C:H coating possessing superior qualities may be achieved through the use of acetylene (ethene, $C_2H_2$) as the precursor hydrocarbon or carbonaceous source gas. Accordingly, $C_2H_2$ was utilized as the hydrocarbon precursor gas for the deposition of a-C:H coatings in the thickness range from approximately 700 to 1500 nm onto the Si or a-SiC interface layer of the Pyrowear 53 test specimens. The accelerating energy for the deposition of the a-C:H coating layer was 450 eV, and the current density of the ion beam was 2.5 mA/cm². As noted above, U.S. Pat. No. 5,482,602 teaches, as a preferred embodiment, the use of $CH_4$ as the hydrocarbon precursor source gas for deposition of the a-C:H coating; however, based on more recent research results by the applicants, a preferred embodiment for the present invention includes the use of $C_2H_2$ as the precursor source gas, as the properties of the resulting coating have been observed to be superior to those that resulted from the use of $CH_4$.

The a-C:H-coated Pyrowear 53 specimens were subsequently subjected to 50,000 specimen rotations in unlubricated sliding frictional contact, to simulate operation in an oil-starved condition, against countersurfaces of several different types of uncoated counterbodies, including the surface-carburized iron alloy, Pyrowear 53, Norton/Cerbec's NBD 200 hot-pressed $Si_3N_4$, and the through-hardened steel alloy, AISI M50. Experimental results indicate that the a-C:H-coated Pyrowear 53 specimens have a coefficient of friction that is significantly lower than that of the uncoated specimen by a factor of nearly 10×, even though the a-C:H-coated Pyrowear 53 specimens were subjected to a higher contact stress. In addition, the wear rate of the a-C:H-coated Pyrowear 53 test specimens was lower than the standard Pyrowear 53 specimen by a factor of 700×, receding at the end of 50,000 specimen rotations less than 1 µm and approximately 500 µm for the coated and uncoated components, respectively. A slight wear track was detected in the a-C:H-coated Pyrowear 53 test specimens, but no detectable wear scars were observed in the uncoated counterbodies up to 500× magnification, indicating that frictional contact between an uncoated surface with an a-C:H-coated surface causes no perceptible degradation to the uncoated surface.

To further demonstrate the efficacy of the broad-beam ion deposition coating methods for depositing a a-C:H coating on the surface of bearing assemblies for helicopter main transmission gearboxes, rig testing of several bearing assemblies in an oil-starved condition was conducted. The tested bearing assemblies included a baseline cylindrical roller/split angular contact ball bearing combination bearing assembly as exemplarily illustrated in FIG. 8, an SB-1231 bearing assembly, wherein the functional components thereof are fabricated of Pyrowear 53, a modified baseline bearing assembly having monolithic, hot pressed $Si_3N_4$ rolling elements substituted for the Pyrowear 53 roller bearing elements, and a modified baseline bearing assembly having a-C:H-coated inner and outer raceways utilizing the broad-beam ion deposition coating method described above. While only the inner and outer raceways of the a-C:H-modified bearing assembly were a-C:H coated for rig testing, one skilled in the art will appreciate that, alternatively, the cylindrical rollers and split angular contact ball bearings may be a-C:H coated, or that both the inner and outer raceways and the rollers and ball bearings may be a-C:H coated.

Rig testing protocol involved heating the lubricating oil flow of approximately 0.6 gallons/minute to a nominal bearing assembly operating temperature of approximately 121° C. (250° F.) while subjecting the running bearing assembly, operating at a rotational speed of 14,400 RPM, to partial loading (about 2250-2750 lbs). Following thermal stabilization of the lubricating oil at the nominal operating temperature, the oil flow was terminated and the lubricating oil was drained from the gearbox to simulate an oil-out (oil-starved) condition.

As noted above, the baseline, uncoated bearing assembly failed after only 120 seconds of operation in the oil-out condition. The modified baseline bearing assembly incorporating $Si_3N_4$ roller bearing elements exhibited a time-to-failure of approximately 22 minutes, nonetheless failing the 60-minutes DoD (Department of Defense) requirement. The failures of the baseline bearing assembly and the ceramic-modified bearing assembly were attended by thermal instabilities within the power transmission subsystem. The a-C:H-modified bearing assembly, in contrast, operated successfully for a full 60 minutes in an oil-out condition. Following the application of test conditions for approximately 292 seconds, the lubricating oil flow was terminated, at which point the temperature of the a-C:H-modified bearing assembly began to rise. The highest temperature achieved by the a-C:H-modified bearing assembly was approximately 243° C. (470° F.). While this is higher than the nominal bearing assembly operating temperature of approximately 121° C. (250° F.), such a temperature is within acceptable limits for a bearing assembly operating in a helicopter main transmission gearbox.

While the foregoing examples illustrate the efficacy and superiority of an a-C:H coating deposited on a cylindrical roller/split angular contact ball bearing combination bearing assembly utilizing the broad-beam ion deposition coating method, one skilled in the art will appreciate that the methods described herein have utility for depositing a-C:H coatings to other types of bearing assemblies. For example, the broad-beam ion deposition coating methods according to the present invention have utility for depositing a-C:H coatings to one or more contact surfaces of other types of bearing assemblies having utility in helicopter applications; examples include a cylindrical roller bearing assembly having a spherical thrust shoulder, a high speed tapered roller bearing assembly, and a single row, angular contact spherical roller bearing assembly. One skilled in the art will also appreciate that the broad-beam ion deposition coating methods according to the present invention are not limited to bearing assemblies utilized in helicopter applications. The broad-beam ion deposition coating methods according to the present invention also have utility for depositing a-C:H coatings on the dynamic or functional surfaces of bearing assemblies having utility in other diverse applications.

It should be understood that the foregoing description is only illustrative of the present invention. Various alternatives and modifications can be devised by those skilled in the art without departing from the invention. Accordingly, the present invention is intended to embrace all such alternatives, modifications and variances that fall within the scope of the appended claims.

What is claimed is:

1. A mechanical system having a plurality of interrelating components, comprising:
   a) a contact surface, the contact surface having
      i) a substrate,
      ii) a carbon-based coating layer on the substrate and
      iii) an adherence-promoting intermediate coating layer between the substrate and the carbon-based coating layer, wherein the adherence-promoting intermediate coating layer includes non-stoichiometric silicon carbide; and
   b) a contact countersurface,
      wherein the contact surface and the contact countersurface are in dynamic contact at least intermittently with respect to each other, wherein the carbon-based coating layer has a coefficient of friction of about 0.5 or less, an atomic hydrogen content of about 5% to about 25%, and an abrasive wear rate of $10^{-5} m^3 m^{-1} N^{-1}$ or less.

2. The mechanical system of claim 1, wherein the carbon-based coating has a hardness of about 10 giga Pascals or more.

3. The mechanical system of claim 1, wherein one of the contact surface and the contact countersurface is a dynamic surface and the other is a static surface.

4. The mechanical system of claim 1, wherein the substrate is selected from the group consisting of iron, aluminum, alloys of the foregoing, and silicon.

5. The mechanical system of claim 1, wherein the mechanical system is a helicopter transmission gearbox, wherein the gearbox exhibits enhanced oil-out survivability tolerance.

6. The mechanical system of claim 1, wherein the mechanical system is bearing assembly.

7. The mechanical system of claim 1, wherein the contact surface has a carbon-based coating layer thereon having a thickness of about 5 micrometers or less thick.

8. A coated, dynamic contact surface, comprising:
   a substrate;
   a carbon-based coating layer on the substrate; and
   an adherence-promoting intermediate coating layer between the substrate and the carbon-based coating layer, wherein the adherence-promoting intermediate coating layer includes non-stoichiometric silicon carbide, and
   wherein the carbon-based coating layer has a coefficient of friction of about 0.5 or less, an atomic hydrogen content of about 5% to about 25%, and an abrasive wear rate of $10^{-5} m^3 m^{-1} N^{-1}$ or less.

9. The contact surface of claim 8, wherein the carbon-based coating layer has a hardness of about 10 giga Pascals or more.

10. A method for increasing oil-out survivability in a mechanical system having a plurality of interrelating components having at least one dynamic surface, comprising providing to at least one dynamic surface a carbon-based coating layer and an adherence-promoting intermediate coating layer between the dynamic surface and the carbon-based coating layer, wherein the adherence-promoting intermediate coating layer includes non-stoichiometric silicon carbide, the carbon-based coating layer having a coefficient of friction of less than about 0.5, an atomic hydrogen content of about 5% to about 25%, and an abrasive wear rate of $10^{-5} m^3 m^{-1} N^{-1}$ or less.

* * * * *